(12) United States Patent
Cho

(10) Patent No.: US 12,255,114 B2
(45) Date of Patent: Mar. 18, 2025

(54) EMBEDDED PACKAGE WITH ELECTRICALLY ISOLATING DIELECTRIC LINER

(71) Applicant: Infineon Technologies AG, Neubiberg (DE)

(72) Inventor: Eung San Cho, Torrance, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/390,603

(22) Filed: Dec. 20, 2023

(65) Prior Publication Data

US 2024/0120248 A1 Apr. 11, 2024

Related U.S. Application Data

(62) Division of application No. 17/511,787, filed on Oct. 27, 2021, now Pat. No. 11,881,437.

(51) Int. Cl.
*H01L 23/00* (2006.01)
*H01L 23/31* (2006.01)
(Continued)

(52) U.S. Cl.
CPC ...... *H01L 23/3135* (2013.01); *H01L 23/3121* (2013.01); *H01L 24/19* (2013.01);
(Continued)

(58) Field of Classification Search
CPC . H01L 23/3135; H01L 23/3121; H01L 24/19; H01L 24/20; H01L 24/24; H01L 25/072; H01L 25/18; H01L 25/50; H01L 2224/2101; H01L 2224/221; H01L 2224/24137; H01L 2924/13055; H01L 2924/13064; H01L 2924/13091;
(Continued)

(56) References Cited

U.S. PATENT DOCUMENTS

2016/0071819 A1 3/2016 Fuergut et al.
2016/0247835 A1 8/2016 Jiang et al.
(Continued)

FOREIGN PATENT DOCUMENTS

DE 102015113208 A1 2/2016
DE 102021101747 A1 7/2021

*Primary Examiner* — Elias Ullah
(74) *Attorney, Agent, or Firm* — Murphy, Bilak & Homiller, PLLC

(57) ABSTRACT

A method of forming a semiconductor package includes producing a package substrate that includes an interior laminate layer, a first metallization layer disposed below the interior laminate layer, and a second metallization layer disposed above the interior laminate layer, providing a first load terminal on a first surface of the first semiconductor die and a second load terminal on a second surface of the first semiconductor die; and a liner of dielectric material on the first semiconductor die; providing a liner of dielectric material on the first semiconductor die; embedding the first semiconductor die within the interior laminate layer such that the first surface of the first semiconductor die faces the second metallization layer, and wherein the liner of dielectric material is disposed on a corner of the first semiconductor die that is between the first and second load terminals of the first semiconductor die.

8 Claims, 9 Drawing Sheets

(51) Int. Cl.
*H01L 25/00* (2006.01)
*H01L 25/07* (2006.01)
*H01L 25/18* (2023.01)

(52) U.S. Cl.
CPC .............. *H01L 24/20* (2013.01); *H01L 24/24* (2013.01); *H01L 25/072* (2013.01); *H01L 25/18* (2013.01); *H01L 25/50* (2013.01); *H01L 2224/2101* (2013.01); *H01L 2224/221* (2013.01); *H01L 2224/24137* (2013.01); *H01L 2924/13055* (2013.01); *H01L 2924/13064* (2013.01); *H01L 2924/13091* (2013.01)

(58) Field of Classification Search
CPC ... H01L 21/568; H01L 23/5389; H01L 24/25; H01L 2224/04105; H01L 2224/2518
See application file for complete search history.

(56) References Cited

U.S. PATENT DOCUMENTS

| | | |
|---|---|---|
| 2016/0315184 A1 | 10/2016 | Ishimaru et al. |
| 2019/0074376 A1 | 3/2019 | Cha et al. |
| 2020/0219846 A1 | 7/2020 | Ji et al. |
| 2021/0043532 A1 | 2/2021 | Yuan et al. |
| 2021/0066495 A1 | 3/2021 | Fuergut et al. |
| 2021/0082889 A1 | 3/2021 | Noquil et al. |
| 2021/0202395 A1* | 7/2021 | Lu ........................... H01L 24/13 |
| 2021/0233837 A1 | 7/2021 | Cho et al. |

* cited by examiner

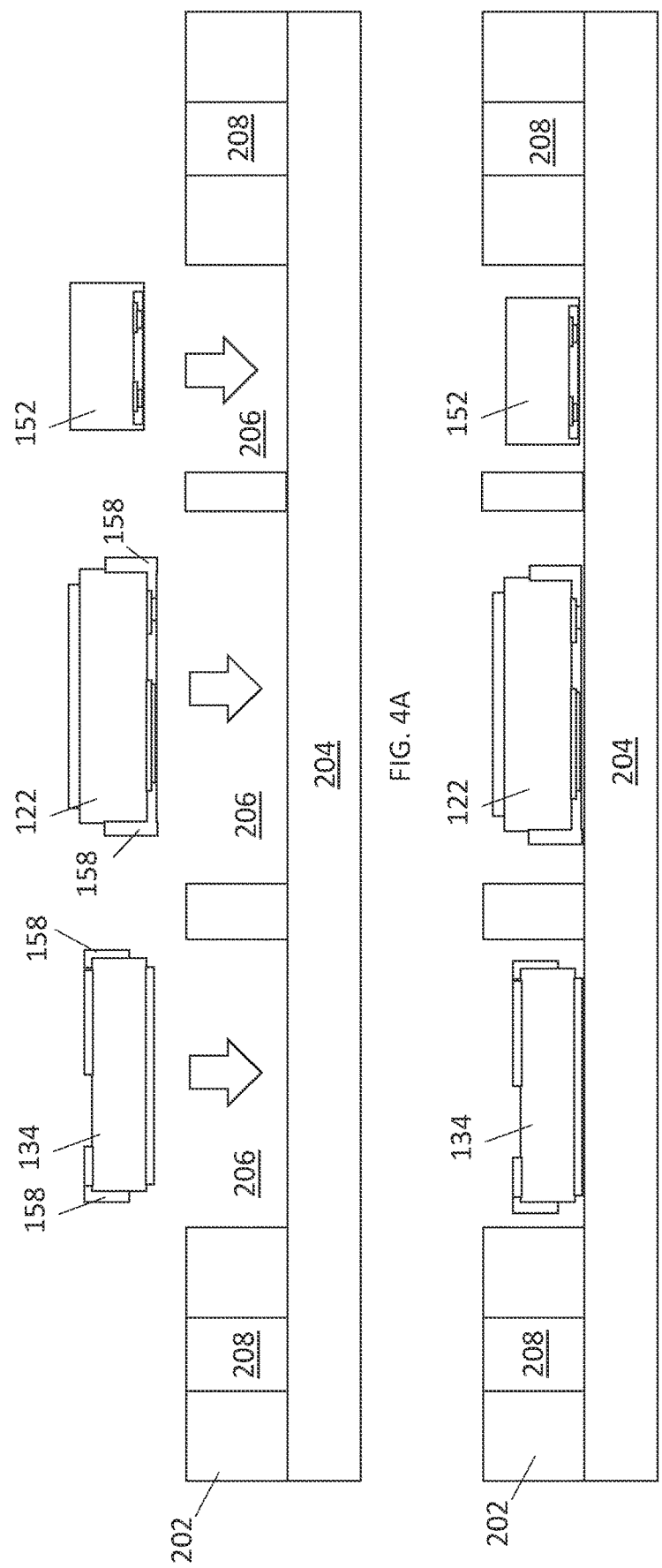

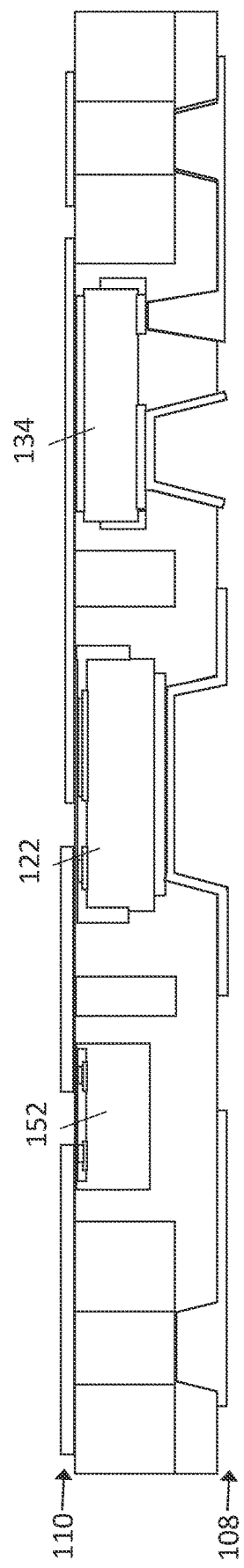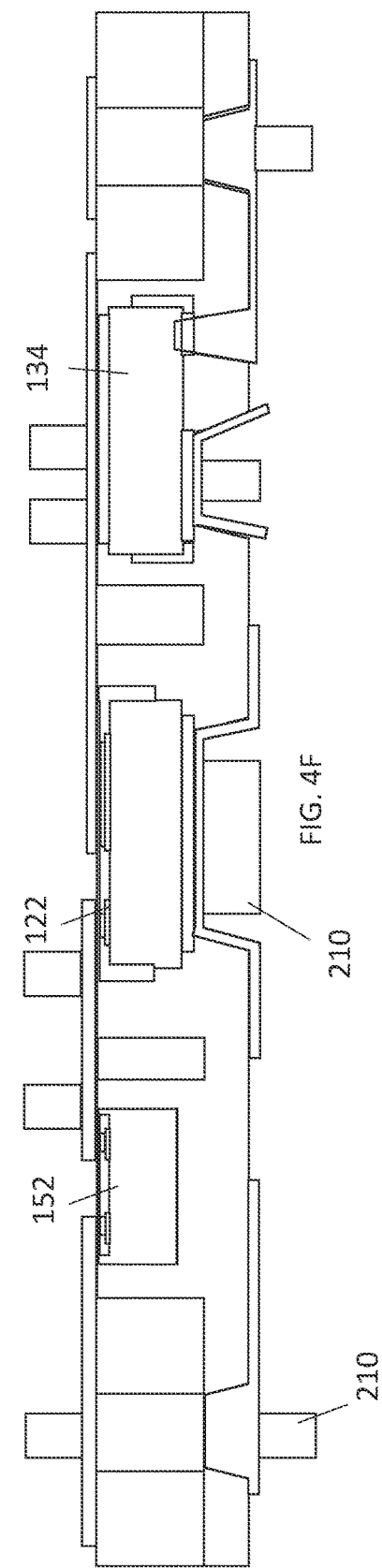

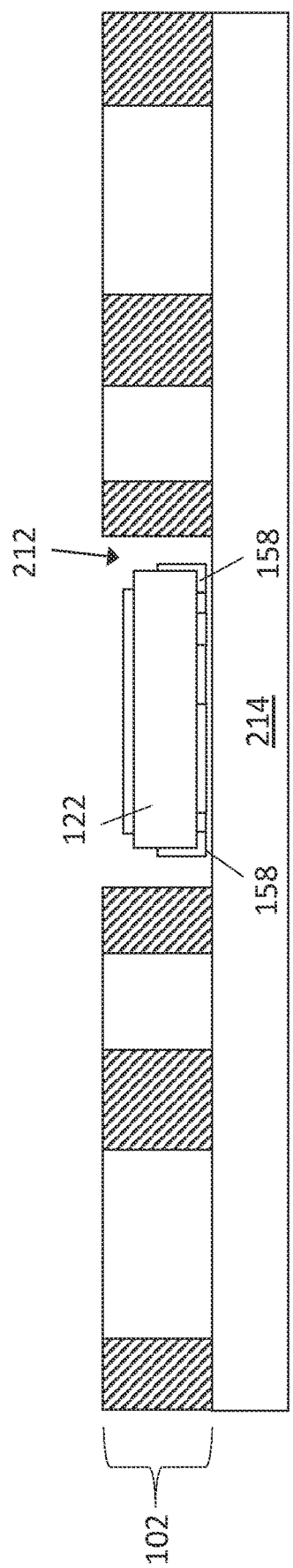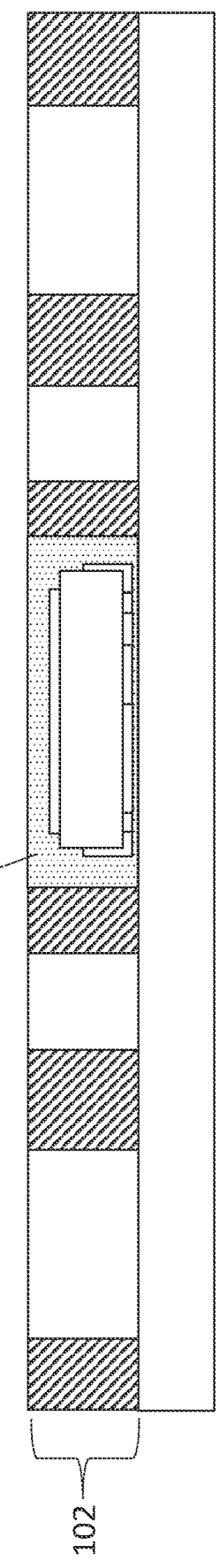

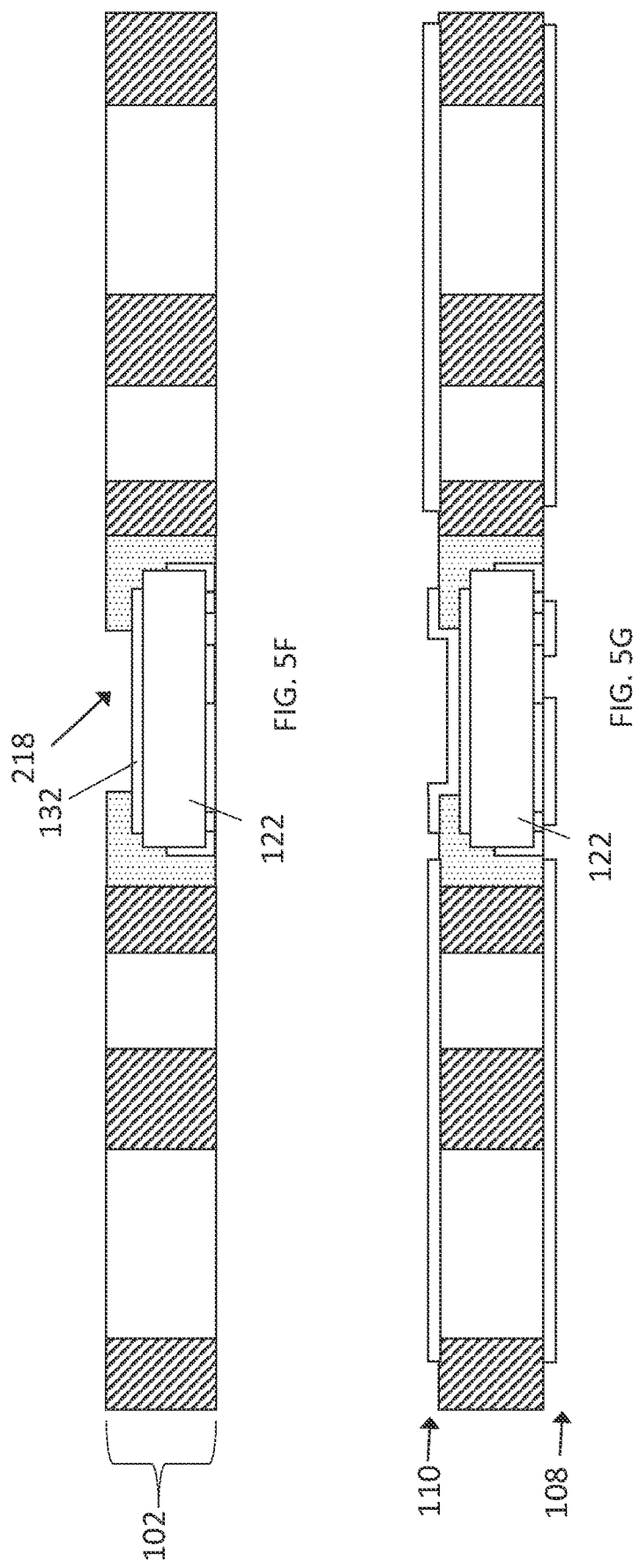

EMBEDDED PACKAGE WITH ELECTRICALLY ISOLATING DIELECTRIC LINER

BACKGROUND

Power stage circuits such as half-bridge and full-bridge circuits are used in many applications such as automotive and industrial applications. These power stage circuits may include power devices that are rated to control large voltages and/or currents, e.g., MOSFETs (metal oxide semiconductor field effect transistors), IGBTs (insulated gate bipolar transistors), diodes, etc., and driver devices that are configured to control the power devices. Generally speaking, it is desirable to provide a power stage circuit with high performance, e.g., low power loss, high current density and efficiency, while maintaining a small areal footprint and having robust electrical interconnections. Conventional semiconductor packaging solutions such as lead frame and metal clip based semiconductor packages have reached physical limits with respect to parameters such as power loss, current density and efficiency. In particular, the soldered connections of these semiconductor packages imposes practical limitations that are not easily overcome.

SUMMARY

A semiconductor assembly is disclosed. According to an embodiment, the semiconductor assembly comprises a package substrate that comprises an interior laminate layer, a first metallization layer disposed below the interior laminate layer, and a second metallization layer disposed above the interior laminate layer, a first semiconductor die that comprises a first load terminal disposed on a first surface of the first semiconductor die and a second load terminal disposed on a second surface of the first semiconductor die that is opposite from the first surface of the first semiconductor die, and a liner of dielectric material on the first semiconductor die, wherein the first semiconductor die is embedded within the interior laminate layer such that the first surface of the first semiconductor die faces the second metallization layer, and wherein the liner of dielectric material is disposed on a corner of the first semiconductor die that is between the first and second load terminals of the first semiconductor die.

Separately or in combination, the corner of the first semiconductor die is between the first surface of the first semiconductor die and a first edge side of the first semiconductor die that extends between the first and second surfaces of the first semiconductor die, and wherein the liner of dielectric material comprises a first part that is disposed on the first surface of the first semiconductor die and extends from the first load terminal to the corner.

Separately or in combination, the first part of the liner of dielectric material extends from the corner along only a portion of the first edge side of the first semiconductor die.

Separately or in combination, the liner of dielectric material comprises a second part that is disposed on the first edge side and extends from the corner along only a portion of the first edge side.

Separately or in combination, the liner of dielectric material comprises a second part that is disposed on a second corner of the first semiconductor die that is between the first surface of the first semiconductor die and a second edge side of the first semiconductor die that extends between the first and second surfaces of the of the first semiconductor die and is opposite from the first surface of the first semiconductor die.

Separately or in combination, the second liner of dielectric material extends along only a part of the second edge side of the first semiconductor die, and wherein the second liner of dielectric material is an epoxy layer.

Separately or in combination, the semiconductor package further comprises a second semiconductor die that comprises a first load terminal disposed on a first surface of the second semiconductor die and a second load terminal disposed on a second surface of the second semiconductor die that is opposite from the first surface of the second semiconductor die, and a liner of dielectric material on the second semiconductor die, wherein the second semiconductor die is embedded within the interior laminate layer such that the first surface of the first semiconductor die faces the first metallization layer, and wherein the liner of dielectric material is disposed on a corner of the second semiconductor die that is between the first and second load terminals of the second semiconductor die.

Separately or in combination, the semiconductor package is configured as an integrated half-bridge circuit, wherein the first and second semiconductor dies are each configured as discrete power transistor dies, wherein the first semiconductor die is a high-side switch of the integrated half-bridge circuit, and wherein the second semiconductor die is a low-side switch of the integrated half-bridge circuit.

Separately or in combination, the semiconductor package further comprises a third semiconductor die embedded within the interior laminate layer, wherein the third semiconductor die is a logic die comprising 1/O terminals disposed on a first surface of the third semiconductor die that faces the second metallization layer, wherein the third semiconductor die is configured to control a switching operation of the first and second semiconductor dies via the 1/O terminals, and wherein the third semiconductor die is laterally electrically isolated from the first semiconductor die by the liner of dielectric material disposed on a first edge region of the first semiconductor die.

Separately or in combination, the first load terminal of the first semiconductor die is a source terminal of the high-side switch, wherein the second load terminal of the second semiconductor die is a drain terminal of the low-side switch, and wherein the first load terminal of the first semiconductor die is electrically connected to the second load terminal of the second semiconductor die by the second metallization layer.

Separately or in combination, the second semiconductor die further comprises a control terminal disposed on the first surface of the first semiconductor die.

Separately or in combination, the second semiconductor die further comprises a control terminal disposed on the second surface of the first semiconductor die.

Separately or in combination, the semiconductor package further comprises a central dielectric structure disposed between the first and second semiconductor dies, wherein a first section of the interior laminate layer is disposed between the second liner of dielectric material disposed on the second edge region of the first semiconductor die and the central dielectric structure, and wherein a second section of the interior laminate layer is disposed between the liner of dielectric material disposed on the first edge region of the second semiconductor die and the central dielectric structure.

Separately or in combination, the dielectric material of the central section is different from the material of the interior laminate layer.

Separately or in combination, the dielectric material of the central section is different from the dielectric material of the liners of dielectric material on the first and second semiconductor dies.

Separately or in combination, the semiconductor package further comprises a first structured contact pad that comprises a structured portion of the first metallization layer and is disposed on the second load terminal of the first semiconductor die, wherein a thickness of the first structured contact pad is at least 50% of a vertical height of the first semiconductor die.

A method of forming a semiconductor package is disclosed. According to an embodiment, the method comprises producing a package substrate that comprises an interior laminate layer, a first metallization layer disposed below the interior laminate layer, and a second metallization layer disposed above the interior laminate layer, providing a first load terminal disposed on a first surface of the first semiconductor die and a second load terminal disposed on a second surface of the first semiconductor die that is opposite from the first surface of the first semiconductor die, and a liner of dielectric material on the first semiconductor die, providing a liner of dielectric material on the first semiconductor die, embedding the first semiconductor die within the interior laminate layer such that the first surface of the first semiconductor die faces the second metallization layer, and wherein the liner of dielectric material is disposed on a corner of the first semiconductor die that is between the first and second load terminals of the first semiconductor die.

Separately or in combination, the first semiconductor die is provided with the liner of dielectric material disposed on the corner of the first semiconductor die prior to the embedding of the first semiconductor die.

Separately or in combination, the corner of the first semiconductor die is between the first surface of the first semiconductor die and a first edge side of the first semiconductor die that extends between the first and second surfaces of the first semiconductor die, and wherein the liner of dielectric material comprises a first part that is disposed on the first surface of the first semiconductor die and extends from the first load terminal to the corner.

Separately or in combination, the liner of dielectric material comprises a second part that is disposed on the first edge side and extends from the corner along only a portion of the first edge side.

Separately or in combination, embedding the first semiconductor die in the interior laminate layer comprises providing a core structure comprising a plurality of openings, arranging the first semiconductor die comprising the liner of dielectric material disposed on the corner of the first semiconductor die within one of the openings, and filling gaps in the openings between the first semiconductor die and the core structure with dielectric material.

Separately or in combination, the method further comprises providing a second semiconductor die that comprises a first load terminal disposed on a first surface of the second semiconductor die and a second load terminal disposed on a second surface of the second semiconductor die that is opposite from the first surface of the second semiconductor die, providing a liner of dielectric material on the second semiconductor die, and embedding the second semiconductor die is within the interior laminate layer such that the first surface of the first semiconductor die faces the first metallization layer, wherein the liner of dielectric material is disposed on a corner of the second semiconductor die that is between the first and second load terminals of the second semiconductor die, and wherein the second semiconductor die is provided with the liner of dielectric material disposed on the corner of the second semiconductor die prior to the embedding of the second semiconductor die.

Separately or in combination, the semiconductor package is configured as an integrated half-bridge circuit, wherein the first and second semiconductor dies are each configured as discrete power transistor dies, wherein the first semiconductor die is a high-side switch of the integrated half-bridge circuit, and wherein the second semiconductor die is a low-side switch of the integrated half-bridge circuit.

Separately or in combination, the first load terminal of the first semiconductor die is a source terminal of the high-side switch, wherein the second load terminal of the second semiconductor die is a drain terminal of the low-side switch, and wherein the first load terminal of the first semiconductor die is electrically connected to the second load terminal of the second semiconductor die by the second metallization layer.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4, which includes FIGS. 4A-4F, illustrates selected steps in a method of forming a semiconductor package, according to an embodiment.

FIG. 5, which includes FIGS. 5A-5G, illustrates selected steps in a method of forming a semiconductor package, according to an embodiment.

DETAILED DESCRIPTION

Embodiments of an embedded semiconductor package that includes one or more semiconductor dies embedded within a laminate layer and has advantageous voltage breakdown characteristics are disclosed herein. The semiconductor package comprises a laminate layer that protects and electrically isolates the semiconductor die or dies and comprises contact pads that form externally accessible points of electrical contact to the terminals of the semiconductor die or dies. At least one of the semiconductor dies may be a power device that is rated to accommodate voltages on the order of 600V, 1200V or more. The power device may include a liner of dielectric material, such as an epoxy material, on an edge surface of the semiconductor die. In particular, the liner of dielectric material may be provided on a corner of the semiconductor die and partially along an edge side of the semiconductor die that is between the load terminals of the device. This hardens the semiconductor package against high voltage breakdown by mitigating breakdown mechanisms including electromigration. The semiconductor package may further comprise dielectric structures in between multiple ones of the semiconductor dies that enhance lateral electrical isolation between high voltage devices.

Figure 1:
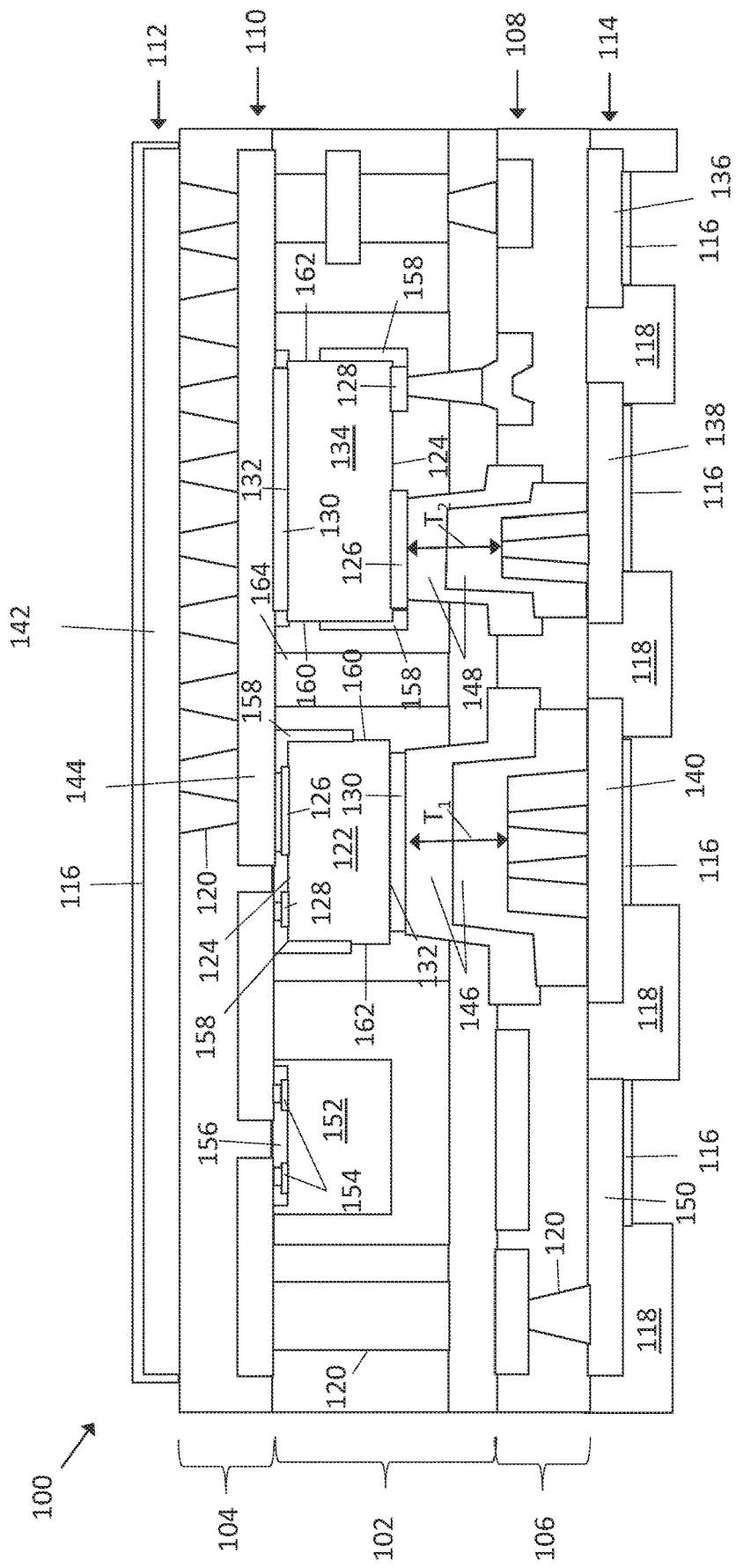
FIG. 1 illustrates a semiconductor package, according to an embodiment.

Referring to FIG. 1, a semiconductor package 100 comprises an interior laminate layer 102, a second laminate layer 104 disposed above the interior laminate layer 102, and a third laminate layer 106 disposed below the interior laminate layer 102. The interior laminate layer 102 and the first and second laminate layers 104, 106 may comprise a dielectric material that is suitable for semiconductor device encapsulation. Examples of these dielectric materials include epoxy materials, blended epoxy and glass fiber materials such as FR-4, FR-5, CEM-4, etc., and resin materials such as bismaleimide trazine (BT) resin. The interior laminate layer 102, the second laminate layer 104, and the third laminate layer 106 may have each same material composition. Alternatively, at least one of the interior laminate layer 102, the second laminate layer 104, and the third laminate layer 106 may have a different material composition from the other layers.

The semiconductor package 100 comprises a first metallization layer 108 disposed below the interior laminate layer 102, a second metallization layer 110 disposed above the interior laminate layer 102, a third metallization layer 112 disposed above the second laminate layer 104, and a fourth metallization layer 114 disposed below the third laminate layer 104. The first, second, third and fourth metallization layers 108, 110, 112 and 114 may each comprise electrically conductive metals such as copper (Cu), aluminium (Al), nickel (Ni), silver (Ag), palladium (Pd) gold (Au), etc., and alloys or combinations thereof. The first, second, third and fourth metallization layers 108, 110, 112 and 114 may each same material composition or at least one of these layers may have a different material composition as other ones of these layers. A surface plating 116, such as an ENEPIG (electroless nickel electroless palladium immersion gold) layer, for example, may be provided on outer surfaces of the third and fourth metallization layers 112, 114, so as to enhance adhesion and/or provide anticorrosion. The semiconductor package 100 may further comprise a solder resist 118, such as a polymer material, disposed between structured regions of the fourth metallization layer 114.

The semiconductor package 100 further comprises vias 120 extending through the laminate layer. These vias 120 are configured to provide vertical electrical interconnect between the metallization layers and the embedded components of the semiconductor package 100 and/or between two vertically separated metallization layers. These vias 120 may comprise so-called blind vias that form electrical connections with the outermost metallization layers, i.e., the third and fourth metallization layers 112, 114 in this embodiment. These vias 120 may additionally comprise so-called buried vias form electrical connections within the substrate. The vias 120 may comprise electrically conductive metals such as copper, aluminium, tungsten, nickel, etc., and alloys or combinations thereof.

The semiconductor package 100 comprises a first semiconductor die 122. The first semiconductor die 122 is embedded within the interior laminate layer 102 such that a first surface 124 of the first semiconductor die 122 faces the second metallization layer 110. In this context, the term embedded means that the first semiconductor die 122 is surrounded on all sides by the interior laminate layer 102 and contained within a vertical space defined by the planes of the upper and lower surfaces of the interior laminate layer 102. The first semiconductor die 122 comprises a first load terminal 126 and a control terminal 128 disposed on the first surface 124 of the first semiconductor die 122, and a second load terminal 130 disposed on a second surface 132 of the first semiconductor die 122 that is opposite from the first surface 124 of the first semiconductor die 122.

The semiconductor package 100 comprises a second semiconductor die 134. The second semiconductor die 134 is embedded within the interior laminate layer 102 such that a second surface 132 of the second semiconductor die 134 faces the second metallization layer 110. In this context, the term embedded means that the second semiconductor die 134 is surrounded on all sides by the interior laminate layer 102 and contained within a vertical space defined by the planes of upper and lower surfaces of the interior laminate layer 102. The second semiconductor die 134 comprises a first load terminal 126 and a control terminal 128 disposed on the first surface 124 of the second semiconductor die 134 and a second load terminal 130 disposed on a second surface 132 of the second semiconductor die 134 that is opposite from the first surface 124 of the second semiconductor die 134.

Generally speaking, the first and second semiconductor dies 122, 134 may be any type of device that is configured to block a voltage, e.g., diode, transistor, thyristor, etc. The first and second load terminals 126, 130 may be the voltage blocking terminals of the device, i.e., the terminals that accommodate operational voltages in an OFF or blocking state of the device. For example, the first and second load terminals 126, 130 may be the source and drain terminals in the case of a MOSFET, collector and emitter terminals in the case of an IGBT, or the anode and cathode terminals in the case of a diode (in which case the control terminal 128 may be omitted from the die). The first and second semiconductor dies 122, 134 may include IV semiconductor materials, e.g., silicon, silicon germanium, silicon carbide, etc., and/or type III-V semiconductor materials, e.g., gallium nitride, gallium arsenide, etc.

According to an embodiment, the first and second semiconductor dies 122, 134 are configured as discrete power transistors. A discrete power transistor is a switching device that is rated to accommodate voltages of at least 100 V (volts) and more commonly on the order of 600 V, 1200V or more and/or is rated to accommodate currents of at least 1 A (amperes) and more commonly on the order of 10 A, 50 A, 100 A or more. Examples of discrete power transistors include MOSFETs (Metal Oxide Semiconductor Field Effect Transistors), IGBTs (Insulated Gate Bipolar Transistors), and HEMTs (High Electron Mobility Transistors), for example. The first and second semiconductor dies 122, 134 may internally comprise multiple transistors or transistor cells connected in parallel with one another.

According to an embodiment, the semiconductor package 100 is configured as an integrated half-bridge circuit. A half-bridge circuit refers to one type of circuit topology that is used in a power conversion circuit, such as a DC to DC converter, DC to AC converter, etc. A half-bridge circuit comprises a high-side switch connected in series with a low-side switch. One load terminal of the high-side switch (e.g., the drain) is connected to a first DC voltage (e.g., a positive potential), one load terminal of the low-side switch (e.g., the source) is connected to a second DC voltage (e.g., negative potential or ground), and the remaining two load terminals (e.g., the source of the high-side switch and the drain of the low-side switch) are connected together to form the output of the half-bridge circuit. The control terminals of the high-side and low-side switch (e.g., the gate terminals) can be switched according to a power control scheme (e.g., pulse width modulation) to produce a desired voltage and frequency at the output of the half-bridge circuit.

In an embodiment wherein the semiconductor package 100 is configured as an integrated half-bridge circuit, the first semiconductor die 122 can be a high-side switch of the half-bridge circuit and the second semiconductor die 134 can be a low-side switch of the half-bridge circuit. In this case, the first and second semiconductor dies 122, 134 may each be identically configured discrete power transistors, wherein the second semiconductor die 134 is flipped upside down in comparison to the first semiconductor die 122. In one particular example, the first and second semiconductor dies 122, 134 are each vertical MOSFET devices, wherein the first load terminal 126 of the first semiconductor die 122 is a source terminal of the high-side switch, the second load terminal 130 of the second semiconductor die 134 is a drain terminal of the low-side switch, the second load terminal 130 of the first semiconductor die 122 is a drain terminal of the of the high-side switch, and the first load terminal 126 of the second semiconductor die 134 is a source terminal of the low-side switch. A similar half-bridge circuit topology may be obtained by the first and second semiconductor dies 122, 134 that are each vertical IGBT devices, except that the source and drain terminals become the collector and emitter terminals, respectively.

The semiconductor package 100 may have the following electrical connectivity. A first contact pad 136 formed in the fourth metallization layer 114 may be electrically connected to the first load terminal 126 of the first semiconductor die 122 and to the second load terminal 130 of the second semiconductor die 134. A second contact pad 138 formed in the fourth metallization layer 114 may be directly electrically connected to the first load terminal 124 of the second semiconductor die 134. A third contact pad 140 formed in the fourth metallization layer 114 may be directly electrically connected to the second load terminal 130 of the first semiconductor die 122. The semiconductor package 100 may further comprise a upper contact pad 142 formed in the third metallization layer 112 which forms an additional point of electrical contact to the first load terminal 126 of the first semiconductor die 122 and to the second load terminal 130 of the second semiconductor die 134. In each case, the electrical connections between the various terminals of the semiconductor dies and the contact pads formed in the fourth metallization layer 114 may be effectuated by the vias 120 and structured portions of the first, second, third and fourth metallization layers 108, 110, 112, 114. As shown, the semiconductor package 100 comprises a structured portion 144 of the second metallization layer 110 that is disposed over the first and second semiconductor dies 122, 134 and is in direct electrical contact with the first load terminal 126 of the first semiconductor die 122 and the second load terminal 130 of the second semiconductor die 134. In this regard, direct electrical contact refers to direct physical contact or an arrangement wherein an intermediary conductive element such as such as a solder, sinter, conductive glue, etc. or a seed layer is disposed between the two structures. In a similar manner, a first structured contact pad 146 is in direct electrical contact with the second load terminal 130 of the first semiconductor die 122 and a second structured contact pad 148 is in direct electrical contact with the first load terminal 124 of the second semiconductor die 134. The first and second structured contact pads 146, 148 may be compound structures comprising structured portions of the first metallization layer 108 and an intermediary metallization formed in between the first and fourth metallization layers 108, 114.

According to an embodiment, a thickness $T_1$ of the first structured contact pad 146 is at least 50% of a vertical height of the first semiconductor die 122, the vertical height of the first semiconductor die 122 being a shortest distance between the first and second surfaces of the 124, 132 of the first semiconductor die 122. Likewise, a thickness $T_2$ of the second structured contact pad 148 may be at least 50% of a vertical height of the second semiconductor die 134, the vertical height of the second semiconductor die 134 being a shortest distance between the first and second surfaces of the 124, 132 of the second semiconductor die 134. By making these structured contact pads to be very thick in this manner, improved thermal conduction and/or electrical conduction can be obtained.

The semiconductor package 100 may further comprise a fourth contact pad 150 formed in the fourth metallization layer 114. The fourth contact pad 150 may be an I/O pad that is used to control the switching of the first and second semiconductor dies 122, 134. According to the depicted embodiment, the semiconductor package 100 further comprises a third semiconductor die 152 embedded within the interior laminate layer 102. The third semiconductor die 152 may be a logic or driver device, e.g., a silicon based device, with I/O (input-output) terminals 154 disposed on a main surface of the third semiconductor die 152 that faces the second metallization layer 110. One or more of the I/O terminals 154 may be electrically connected to the fourth contact pad 150 by the vias 120 and structured metallization regions in a similar manner as previously described. One or more of the I/O terminals 154 may be electrically connected to the control terminals 128 of the first and second semiconductor dies 122, 134 by a structured portion of the second metallization layer 110. A imide layer 156 may be provided on the main surface of the third semiconductor die 152 so as to electrically isolate the I/O terminals 154 from one another. In an embodiment wherein the semiconductor package 100 is configured as an integrated half-bridge circuit, the third semiconductor die 152 may be a driver die that is configured to control a switching operation of the high-side switch and the low-side switch of the half-bridge circuit. In another embodiment, the third semiconductor die 152 may be omitted from the semiconductor package 100. In that case, the control terminals 128 can be directly connected to externally accessible contact pads and thus the switching of the first and second semiconductor dies 122, 134 can be controlled externally.

The semiconductor package 100 further comprises a liner of dielectric material 158 on the first semiconductor die 122. The liner of dielectric material 158 may be disposed on a corner of the first semiconductor die 122 that is between the first and second load terminals 126, 130. The corner of the first semiconductor die 122 may be an intersection between a first edge side 160 of the first semiconductor die 122 that extends between the first and second surfaces 124, 132 of the first semiconductor die 122. As shown, the liner of dielectric material 158 comprises a first part that extends between the first load terminal 126 of the first semiconductor die 122 and a corner of the first semiconductor die 122 that is between the first surface 124 of the first semiconductor die 122 and a first edge side 160 of the first semiconductor die 122 that extends between the first and second surfaces 124, 132 of the first semiconductor die 122. The liner of dielectric material 158 additionally comprises a second part that extends from the corner along only a portion of the first edge side 160 of the first semiconductor die 122, meaning that the liner of dielectric material 158 does not completely cover the first edge side 160 such that a lower part of the first edge side 160 extending to the second surface 132 of the first semiconductor die 122 is exposed from the liner of dielectric material 158. The liner of dielectric material 158 may also be disposed on a second corner of the first semiconductor die 122 that is between the first surface 124 of the first semiconductor die 122 and a second edge side 162 of the first semiconductor die 122 that extends between the first and second surfaces 124, 132 of the first semiconductor die 122 and is opposite from the first surface 124 of the first semiconductor die 122. As shown, the liner of dielectric material 158 disposed on both corners of the first semiconductor die 122 is a continuous structure. This is not necessary, however. In other embodiments, the liner of dielectric material 158 on the first semiconductor die 122 may be interrupted, e.g., as is the case for the second semiconductor die 134.

According to an embodiment, the liner of dielectric material 158 has a different material composition as the interior laminate layer 102. For example, the liner of dielectric material 158 can comprise an epoxy or a blended epoxy material (please provide examples), whereas the interior laminate layer 102 can comprise a resin material such as bismaleimide trazine (BT) resin. In one particular embodiment, the material composition of the liner of dielectric material 158 is such that the liner of dielectric material 158 has a greater dielectric strength (i.e., the applied voltage at which dielectric breakdown occurs) than the material of the interior laminate layer 102.

By providing the liner of dielectric material 158 on at least one corner of the first semiconductor die 122 that is between the first and second load terminals 126, 130, the high voltage robustness of the semiconductor package 100 is increased. Among other things, the material composition and arrangement of the liner of dielectric material 158 mitigates the possibility of any voids or gaps forming between the edge surfaces of the first semiconductor die 122 and the interior laminate layer 102. This mitigates the risk of breakdown failures such as by electromigration.

The semiconductor package 100 may further comprise a liner of dielectric material 158 on the second semiconductor die 134. The liner of dielectric material 158 on the second semiconductor die 134 may be disposed on corners of the second semiconductor die 134 in a similar manner as previously described with reference to the first semiconductor die 122. The liner of dielectric material 158 on the second semiconductor die 134 may provide at least some of the same benefits with respect to voltage breakdown as the liner of dielectric material 158 on the first semiconductor die 122 as previously described.

The semiconductor package 100 further comprises a central dielectric structure 164 disposed between the first and second semiconductor dies 122, 134. As shown, the central dielectric structure 164 may be arranged such that a first section of the interior laminate layer 102 is disposed between the liner of dielectric material 158 on the first semiconductor die 122 and the central dielectric structure 164 such that a second section of the interior laminate layer 102 is disposed between the liner of dielectric material 158 on the second semiconductor die 134 and the central dielectric structure 164. According to an embodiment, the material composition of the central dielectric structure 164 is different from the material composition of the interior laminate layer 102 and/or is different from the composition of the liners of dielectric material 158 on the first and second first and second semiconductor dies 122, 134. Thus, three different types of dielectric structures may be laterally interposed between the first and second semiconductor dies. As a result, lateral electrical isolation between the first and second semiconductor dies 122, 134 may be enhanced. In one particular example, the a central dielectric structure 164 comprises a pre-preg (pre-impregnated fiber material) material such as such as FR-4, FR-5, CEM-4, etc., the interior laminate layer 102 comprises a resin material such as bismaleimide trazine (BT) resin, and the liners of dielectric material 158 on the first and second first and second semiconductor dies 122, 134 comprise an epoxy material.

Figure 2:
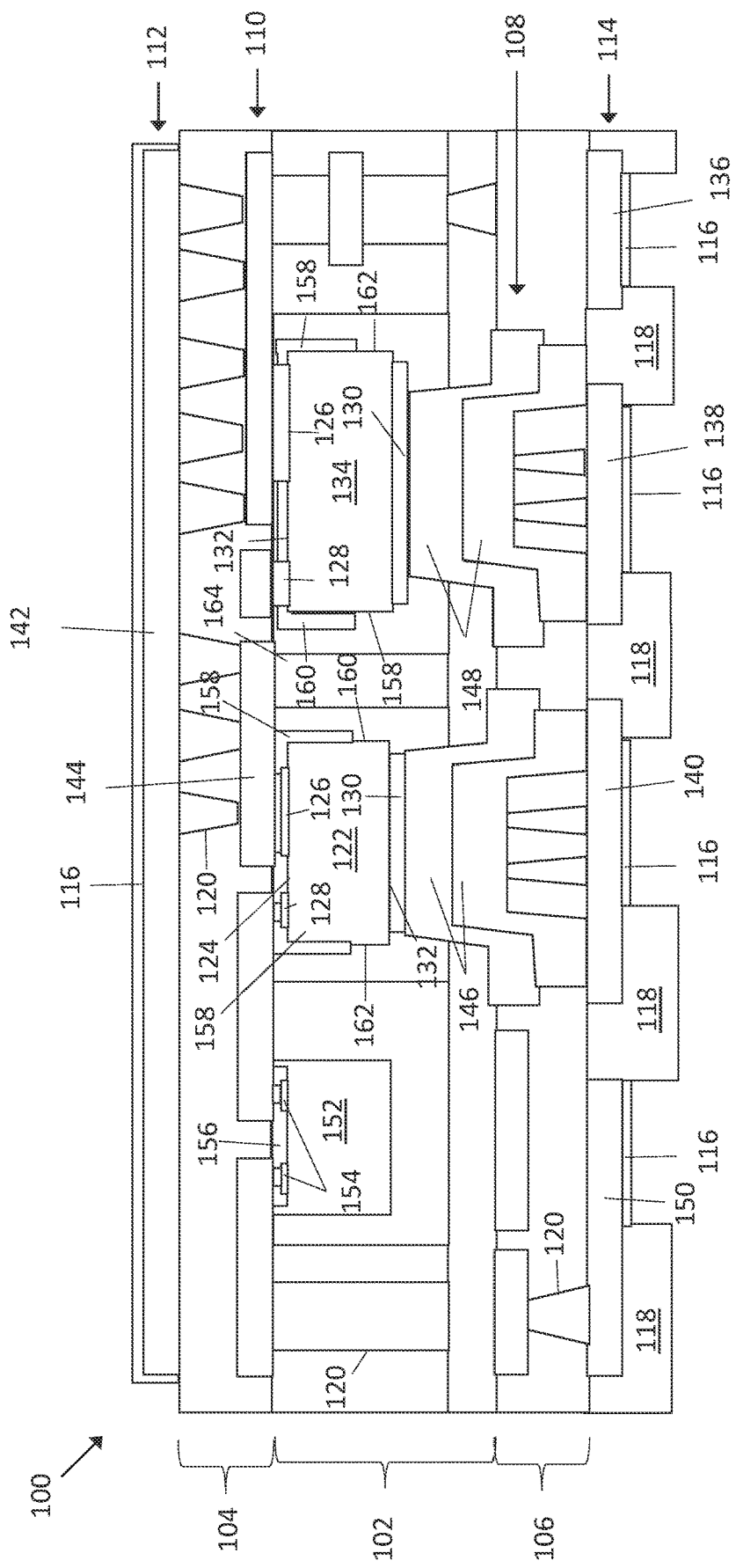
FIG. 2 illustrates a semiconductor package, according to another embodiment.

Referring to FIG. 2, a semiconductor package 100 is depicted, according to another embodiment. The semiconductor package 100 of FIG. 2 is different from the semiconductor package 100 of FIG. 1 in that the terminal configuration of the second semiconductor die 134 is changed such that the control terminal 128 and the second load terminal 128 are disposed on the same surface of the second semiconductor die 134, which is indicated as being the second surface 132 of the second semiconductor die 134 in the figure. Stated another way, the second surface 132 of the second semiconductor die 134 which faces the second layer of metallization 110 becomes the main surface of the die. Thus, different from the embodiment of FIG. 1 which utilizes first and second semiconductor dies 122, 134 that are identical to one another, the semiconductor package 100 of FIG. 2 uses first and second semiconductor dies 122, 134 that are different from another. These first and second semiconductor dies 122, 134 can form the high-side switch and low-side switch, respectively of a half-bridge circuit in a similar manner as previously described. In this case, providing the liner of dielectric material 158 on the second semiconductor die 134 may be particularly advantageous, as it provides electrical isolation between the control terminal 128 and the metallization connected to the drain potential.

Figure 3:
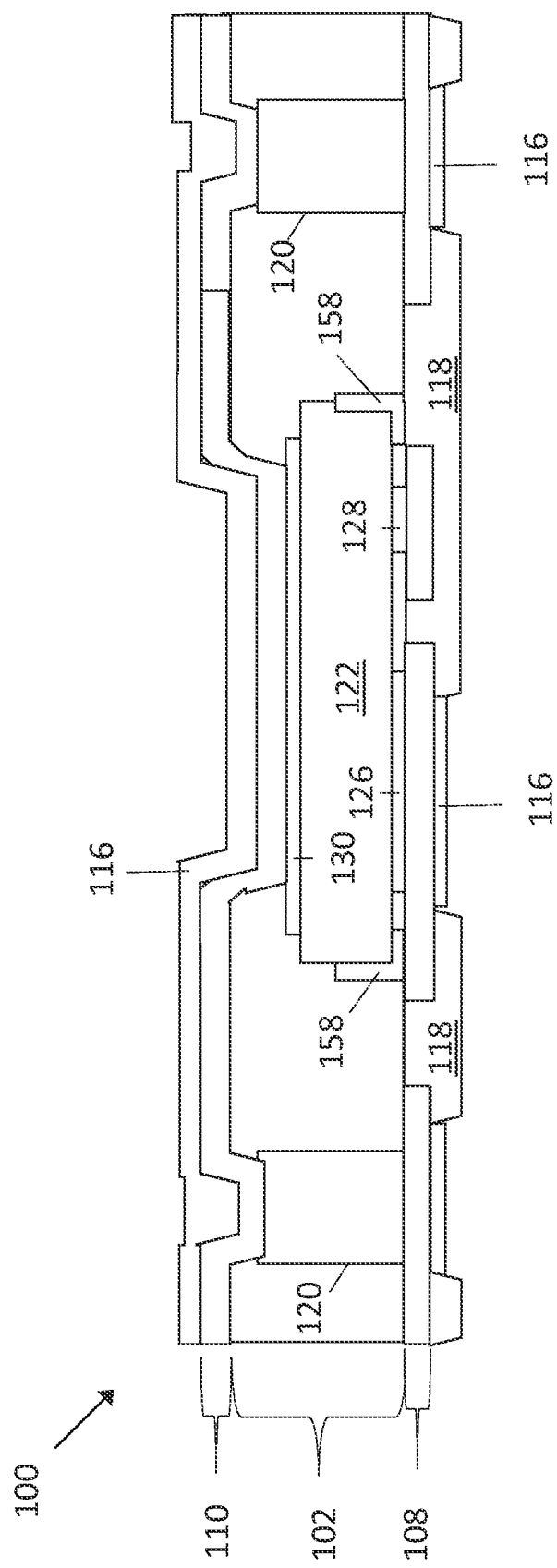
FIG. 3 illustrates a semiconductor package, according to another embodiment.

Referring to FIG. 3, a semiconductor package 100 is depicted, according to another embodiment. In this embodiment, the semiconductor package 100 includes only a first semiconductor die 122 embedded within an interior laminate layer 102. The semiconductor package 100 may be configured as a discrete power device, such as a power MOSFET, wherein the interior laminate layer 102 protects the first semiconductor die 122, and the semiconductor package 100 comprises contact pads formed in the first and second metallization layers 108, 110 that provide points of electrical contact to the various terminals of the first semiconductor die 122. The first semiconductor die 122 comprises the liner of dielectric material 158 between the first and second load terminals 126, 130 of the respective semiconductor die in a similar manner as previously described, thereby providing the advantageous voltage breakdown capability as described above.

Referring to FIG. 4, a method of forming the semiconductor package 100 is depicted, according to an embodiment. Referring to FIG. 4A, a core structure 202 is provided on a first carrier 204. The first carrier 204 may be a tacky lamination tape, for example. The core structure 202 may be a frame-like structure formed from an organic insulating material, e.g., blended epoxy and glass fiber materials such as FR-4, FR-5, CEM-4, etc. The core structure 202 comprises a plurality of openings 206 that are dimensioned to receive the various semiconductor dies to be embedded in the semiconductor package 100. The core structure 202 is additionally provided to comprise a plurality of metal via structures 208 that extend through the core structure 202, thereby providing the buried via structures. The first, second and third semiconductor dies 122, 134, 152 are provided and arranged in one of the openings 206. The first semiconductor die 122 is provided to comprise the liner of dielectric material 158 disposed on the corner or corners of the first semiconductor die 122 in a manner previously described before the subsequent step of embedding the first semiconductor die 122 within the interior laminate. Likewise, the second semiconductor die 134 is provided to comprise the liner of dielectric material 158 disposed on the corner or corners of the second semiconductor die 134 in a manner previously described before the subsequent step of embedding the second semiconductor die 134 in within the interior laminate.

Figure 4C:
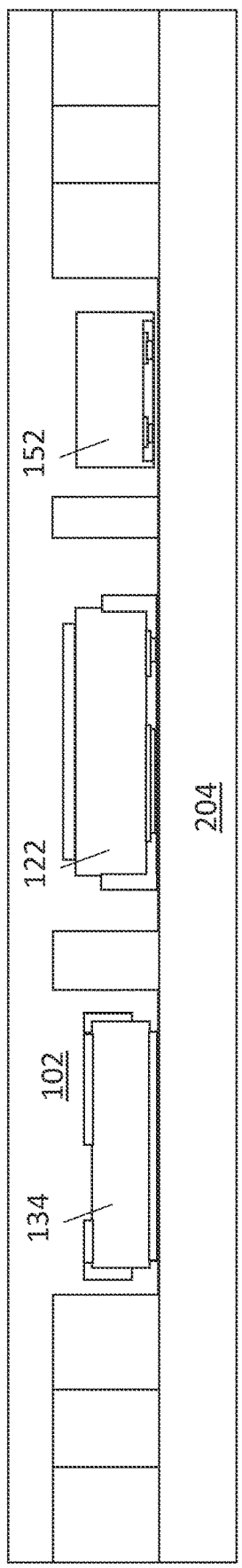
Figure 4D:
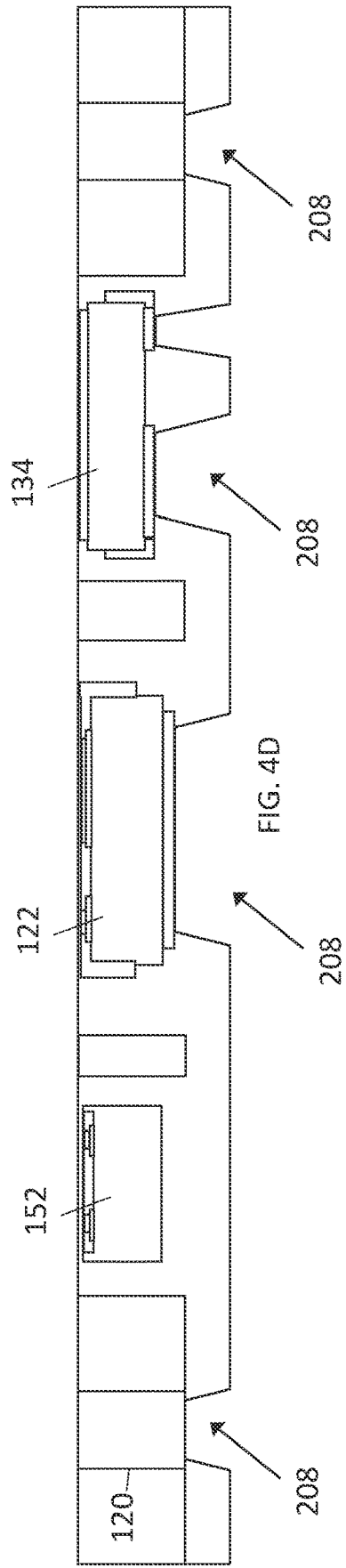

Referring to FIG. 4C, the interior laminate layer 102 is formed so as to embed the first, second and third semiconductor dies 122, 134, 152 within the interior laminate layer 102. The interior laminate layer 102 can be an ABF (Ajinomoto Build-up Film), for example. Referring to FIG. 4D, the first carrier 204 is removed and outer openings 208 are formed in the interior laminate layer 102. The outer openings 208 may be formed by a laser etching technique, for example. The outer openings 208 expose the terminals of the first and second semiconductor dies 122, 134 to be connected to the first metallization layer 108, along with the buried via structures 120. Referring to FIG. 4E, a plating process is performed to form the first and second metallization layers 108, 110. The plating process may be an electroplating process, for example. Referring to FIG. 4F, conductive pillars 210 are provided on the structured portions of the first and second metallization layers 108, 110. These conductive pillars 210 form the blind via structures along with the intermediate metal structure of the first and second structured contact pads 146, 148 as previously described. The conductive pillars 210 may be formed by a further plating process, for example. Subsequently, a process sequence of further lamination, polishing, laser drilling, plating and solder mask formation may be performed so as to form the further layers of the semiconductor package 100, e.g., the third and fourth layers of metallization 112, 114, the second and third laminate layers 104, 106, the solder mask 118, and so forth.

Figure 5A:
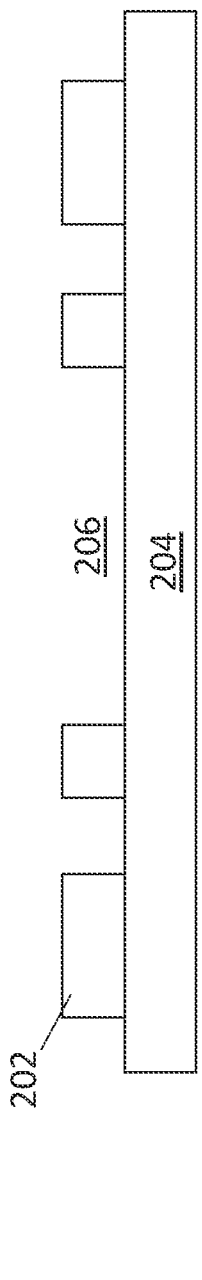
Figure 5B:
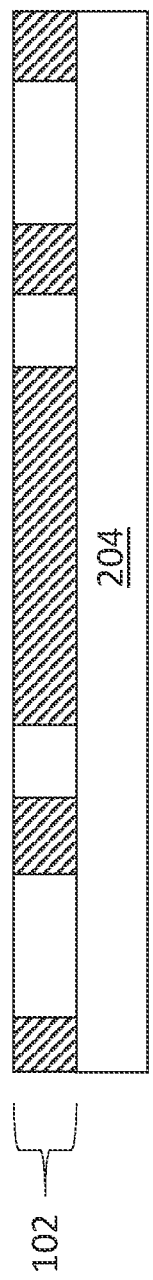
Figure 5C:

Referring to FIG. 5, a method of forming the semiconductor package 100 is depicted, according to another embodiment. Referring to FIG. 5A, a core structure 202 comprising a plurality of openings 206 is provided. According to an embodiment, the core structure 202 is a metal structure, such as a copper or aluminium structure, and thus provides buried via structures in the completed semiconductor package 100. The core structure 202 is arranged on a first carrier 204, which may be a tacky lamination tape, for example. As shown in FIG. 5B, the interior laminate layer 102 is formed by performing a lamination process that fills each of the openings 206 of the core structure 202 with a dielectric material. The dielectric material may be a pre-preg material, for example. Subsequently, as shown in FIG. 5C, the first carrier 204 is removed and an etching process is performed to form a further opening 212 in the interior laminate layer 102. Referring to FIG. 5D, the structure comprising the core and the interior laminate layer 102 is placed on a second carrier 214, which may be a carrier tape, for example. The first semiconductor die 122 is provided and comprises the liner of dielectric material 158 disposed on the corner or corners of the first semiconductor die 122 in a manner previously described before the subsequent step of embedding the first semiconductor die 122 in within the interior laminate. The first semiconductor die 122 is arranged on the second carrier 214 within the further opening 212 in the interior laminate layer 102. As shown in FIG. 5E, a second lamination process is performed so as to fill any gaps in the opening between the first semiconductor die 122 and the interior laminate layer 102 with a dielectric material 216. The second lamination process can be an ABF (Ajinomoto Build-up Film) process, for example.

Referring to FIG. 5F, the second carrier 214 is removed and a further opening 218 is formed in the interior laminate layer 102 so as to expose the second load terminal 130 of the first semiconductor die 122. The further opening 218 in the interior laminate layer 102 may be formed by a lasering technique, for example. Subsequently, as shown in FIG. 5G, the first and second metallization layer 108, 110 are formed. This may be done by a plating process, for example. A seed layer may be deposited on the exposed conductive surfaces before the plating surfaces. After forming the first and second metallization layers 108, 110, subsequent layers such as a solder mask and an ENEPIG layer may be formed, for example.

The semiconductor package 100 described herein may be a so-called "chip-embedded" package. A chip-embedded package comprises an encapsulant body formed from multiple constituent layers of dielectric material that are laminated (stacked) on top of one another. This package type differs from a molded package wherein the encapsulant body is provided by a monolithic region of electrically insulating material, such as a mold compound that encapsulates the semiconductor die and associated electrical connectors, e.g., bond wires, clips, etc. In a chip-embedded package, each constituent laminate layer can generally comprise any dielectric material that is suitable for semiconductor device encapsulation. Examples of these dielectric materials include epoxy materials, blended epoxy and glass fiber materials such as FR-4, FR-5, CEM-4, etc., and resin materials such as bismaleimide trazine (BT) resin. A chip-embedded package may also include multiple layers of metallization, e.g., copper, aluminum, etc., and alloys thereof, formed on top of at least some of the constituent laminate layers. These layers of metallization can be structured to form internal interconnect lines within the package body as well as the bond pads that are exposed at the outer surfaces of the package body. Due to the electrical interconnect provided by the internal structured metallization, a chip-embedded package does not require a lead frame or electrical connectors such as bond wires or clips. Therefore, the semiconductor package 100 may be devoid of a die pad that accommodates the semiconductor dies and/or devoid of conductive leads that are formed from the same lead frame structure as a die pad.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of forming a semiconductor package, the method comprising:

producing a package substrate that comprises an interior laminate layer, a first metallization layer disposed below the interior laminate layer, and a second metallization layer disposed above the interior laminate layer;

providing a first semiconductor die with a first load terminal disposed on a first surface of the first semiconductor die and a second load terminal disposed on a second surface of the first semiconductor die that is opposite from the first surface of the first semiconductor die; and providing a liner of dielectric material on the first semiconductor die;

embedding the first semiconductor die within the interior laminate layer such that the first surface of the first semiconductor die faces the second metallization layer, and wherein the liner of dielectric material is disposed on a corner of the first semiconductor die that is between the first and second load terminals of the first semiconductor die.

2. The method of claim 1, wherein the first semiconductor die is provided with the liner of dielectric material disposed on the corner of the first semiconductor die prior to the embedding of the first semiconductor die.

3. The method of claim 2, wherein the corner of the first semiconductor die is between the first surface of the first semiconductor die and a first edge side of the first semiconductor die that extends between the first and second surfaces of the first semiconductor die, and wherein the liner of dielectric material comprises a first part that is disposed on the first surface of the first semiconductor die and extends from the first load terminal to the corner.

4. The method of claim 3, wherein the liner of dielectric material comprises a second part that is disposed on the first edge side and extends from the corner along only a portion of the first edge side.

5. The method of claim 1, wherein embedding the first semiconductor die in the interior laminate layer comprises:

providing a core structure comprising a plurality of openings;

arranging the first semiconductor die comprising the liner of dielectric material disposed on the corner of the first semiconductor die within one of the openings; and filling gaps in the openings between the first semiconductor die and the core structure with dielectric material.

6. The method of claim 5, further comprising:

providing a second semiconductor die that comprises a first load terminal disposed on a first surface of the second semiconductor die and a second load terminal disposed on a second surface of the second semiconductor die that is opposite from the first surface of the second semiconductor die;

providing a liner of dielectric material on the second semiconductor die; and embedding the second semiconductor die is within the interior laminate layer such that the first surface of the first semiconductor die faces the first metallization layer, wherein the liner of dielectric material is disposed on a corner of the second semiconductor die that is between the first and second load terminals of the second semiconductor die, and wherein the second semiconductor die is provided with the liner of dielectric material disposed on the corner of the second semiconductor die prior to the embedding of the second semiconductor die.

7. The method of claim 6, wherein the semiconductor package is configured as an integrated half-bridge circuit, wherein the first and second semiconductor dies are each configured as discrete power transistor dies, wherein the first semiconductor die is a high-side switch of the integrated half-bridge circuit, and wherein the second semiconductor die is a low-side switch of the integrated half-bridge circuit.

8. The method of claim 7, wherein the first load terminal of the first semiconductor die is a source terminal of the high-side switch, wherein the second load terminal of the second semiconductor die is a drain terminal of the low-side switch, and wherein the first load terminal of the first semiconductor die is electrically connected to the second load terminal of the second semiconductor die by the second metallization layer.

* * * * *